(12) United States Patent
Noguchi et al.

(10) Patent No.: US 7,479,442 B2
(45) Date of Patent: Jan. 20, 2009

(54) METHOD OF MANUFACTURING SINGLE CRYSTAL SI FILM

(75) Inventors: Takashi Noguchi, Gyeonggi-do (KR); Wenxu Xianyu, Gyeonggi-do (KR); Huaxiang Yin, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 262 days.

(21) Appl. No.: 11/071,175

(22) Filed: Mar. 4, 2005

(65) Prior Publication Data

US 2006/0121691 A1 Jun. 8, 2006

(30) Foreign Application Priority Data

Dec. 3, 2004 (KR) ........................ 10-2004-0101118

(51) Int. Cl.
*H01L 21/461* (2006.01)
(52) U.S. Cl. .................. 438/458; 438/459; 438/795; 257/E21.6
(58) Field of Classification Search ............... 438/458, 438/455; 257/E21.6, E21.7
See application file for complete search history.

(56) References Cited

U.S. PATENT DOCUMENTS

| | | | | |
|---|---|---|---|---|
| 5,206,627 A | * | 4/1993 | Kato | 340/674 |
| 5,374,564 A | * | 12/1994 | Bruel | 438/455 |
| 5,877,070 A | * | 3/1999 | Goesele et al. | 438/458 |
| 5,882,987 A | * | 3/1999 | Srikrishnan | 438/458 |
| 5,985,742 A | * | 11/1999 | Henley et al. | 438/515 |
| 6,180,496 B1 | * | 1/2001 | Farrens et al. | 438/455 |
| 6,180,497 B1 | * | 1/2001 | Sato et al. | 438/458 |
| 6,306,729 B1 | * | 10/2001 | Sakaguchi et al. | 438/458 |
| 6,326,279 B1 | * | 12/2001 | Kakizaki et al. | 438/406 |
| 6,382,292 B1 | * | 5/2002 | Ohmi et al. | 156/584 |
| 6,500,732 B1 | * | 12/2002 | Henley et al. | 438/459 |
| 6,961,361 B1 | * | 11/2005 | Tanaka | 372/101 |
| 2002/0048864 A1 | * | 4/2002 | Yamazaki et al. | 438/151 |
| 2004/0241960 A1 | * | 12/2004 | Maurice et al. | 438/458 |
| 2005/0048738 A1 | * | 3/2005 | Shaheen et al. | 438/458 |

OTHER PUBLICATIONS

Quirk, Michael & Serda, Julian. (2001). Semiconductor Manufacturing Technology. Upper Saddle River: Prentice Hall. pp. 644.*

* cited by examiner

*Primary Examiner*—Stephen W Smoot
(74) *Attorney, Agent, or Firm*—Buchanan Ingersoll & Rooney PC

(57) ABSTRACT

Provided is a method of manufacturing a single crystal Si film. The method includes: preparing a Si substrate on which a first oxide layer is formed and an insulating substrate on which a second oxide layer is formed; forming a dividing layer at a predetermined depth from a surface of the Si substrate by implanting hydrogen ions from above the first oxide layer; bonding the insulating substrate to the Si substrate so that the first oxide layer contacts the second oxide layer; and forming a single crystal Si film having a predetermined thickness on the insulating substrate by cutting the dividing layer by irradiating a laser beam from above the insulating substrate. Therefore, a single crystal Si film having a predetermined thickness can be formed on an insulating substrate.

17 Claims, 4 Drawing Sheets

METHOD OF MANUFACTURING SINGLE CRYSTAL SI FILM

CROSS-REFERENCE TO RELATED PATENT APPLICATIONS

This application claims the benefit of Korean Patent Application No. 10-2004-00101118, filed on Dec. 3, 2004, in the Korean Intellectual Property Office, the disclosure of which is incorporated herein in its entirety by reference.

BACKGROUND OF THE INVENTION

1. Field of the Invention

The present invention relates to a method of manufacturing a single crystal Si film, and more particularly, to a method of manufacturing a single crystal Si film that can be formed on a substrate which is sensitive to heat.

2. Description of the Related Art

Poly crystalline silicon (poly-Si) is applied to various electronic devices, such as flat display devices and solar cells, due to its high mobility compared to amorphous silicon (a-Si). However, poly crystalline silicon has inferior mobility and homogeneity to single crystal silicon.

Single crystal silicon is especially useful in a system on panel (SOP) structure in which a system is formed directly on a display panel. The mobility of single crystal silicon is greater than 300 cm$^2$/Vs. High quality switching devices for display devices can be obtained from single crystal silicon.

A critical factor in manufacturing single crystal silicon is the limitation of temperature. That is, the manufacturing process can not be performed at a temperature greater than that which the glass or plastic base material can withstand.

The smart-cut method of manufacturing a silicon on insulator (SOI) wafer includes an annealing process at a temperature greater than 1000° C. This method comprises coating an oxide film onto an initial bare wafer by thermal oxidation, forming a boundary layer using a hydrogen dopant by implanting hydrogen ions H$^+$ underneath the surface of the wafer, bonding the wafer to a substrate, forming silicon on the substrate by separating the boundary layer, and annealing.

The thermal oxidation is performed at a temperature of greater than 900° C., and the annealing is performed at a temperature of up to 1100° C. The high temperature processes may deform the substrate. The conventional method of manufacturing the SOI wafer limits the use of materials for the substrate and gives a thermal shock to the selected material. Therefore, obtaining the desired performance from silicon is difficult.

SUMMARY OF THE INVENTION

The present invention provides a method of manufacturing a single crystal Si film that can be formed on a substrate which is sensitive to heat.

According to an aspect of the present invention, there is provided a method of manufacturing a single crystal Si film, comprising: preparing a Si substrate on which a first oxide layer is formed and an insulating substrate on which a second oxide layer is formed; forming a dividing layer at a predetermined depth from a surface of the Si substrate by implanting hydrogen ions from above the first oxide layer; bonding the insulating substrate to the Si substrate so that the first oxide layer contacts the second oxide layer; and forming a single crystal Si film having a predetermined thickness on the insulating substrate by cutting the dividing layer by irradiating a laser beam from above the insulating substrate.

Here, preparing the Si substrate on which a first oxide layer is formed includes: preparing the Si substrate; and forming the first oxide layer on the surface of the Si substrate.

Also, preparing the insulating substrate on which a second oxide layer is formed includes: preparing the insulating substrate; and forming the second oxide layer on the surface of the insulating substrate.

The method further comprises activating the first oxide layer and the second oxide layer by treating their surfaces using oxygen plasma, between forming the dividing layer and bonding the insulating substrate.

Also, forming the single crystal Si film having a predetermined thickness on the insulating substrate by cutting the dividing layer by irradiating a laser beam from above the insulating substrate, includes: heating the dividing layer by irradiating a laser beam from above the insulating substrate; cutting the dividing layer; and removing residue of the dividing layer remaining on the insulating substrate after cutting the dividing layer using a polishing apparatus to obtain a single crystal Si film having a predetermined thickness on the insulating substrate.

In the present invention, the insulating substrate is a transparent substrate, such as a glass substrate or a plastic substrate.

The dividing layer is located less than 1000 Å below the surface of the Si substrate, and the thickness of the single crystal Si film is less than 1000 Å.

In the present invention, the laser beam can be a continuous wave (CW) YAG laser beam or a ultraviolet pulsed laser beam, and the wavelength of the laser beam is in the range of 400-800 nm.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

FIGS. 1A through 1G are cross-sectional views illustrating a method of manufacturing a single crystal Si film according to an embodiment of the present invention.

Figure 1A:
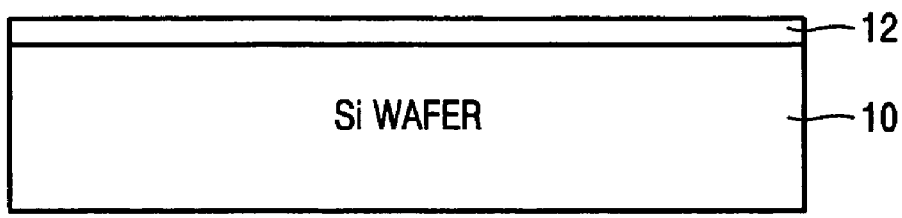
FIGS. 1A through 1G are cross-sectional views illustrating a method of manufacturing a single crystal Si film according to an embodiment of the present invention.
Figure 1B:
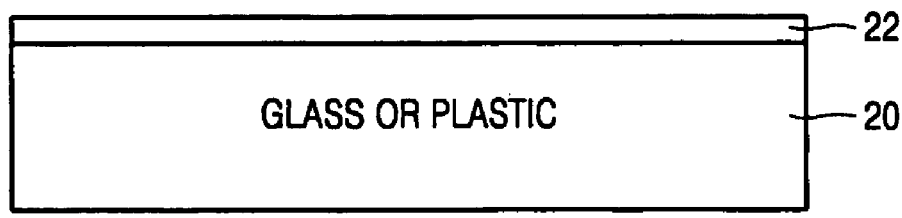

Referring to FIGS. 1A and 1B, a first oxide layer 12 is formed on a Si substrate 10, and a second oxide layer 22 is formed on an insulating substrate 20. For example, after preparing the Si substrate 10, the first oxide layer 12, such as a SiO$_2$ layer, can be formed on the Si substrate 10 using chemical vapor deposition (CVD). In the same manner, the second oxide layer 22, such as a SiO2 layer, can be formed on the insulating substrate 20 using CVD. The first oxide layer 12 and the second oxide layer 22 will function as bonding layers, after activation by a surface treatment using oxygen O$_2$ plasma in a subsequent process. A transparent substrate, such as a glass substrate or a plastic substrate, can be used as the insulating substrate 20.

Figure 1C:
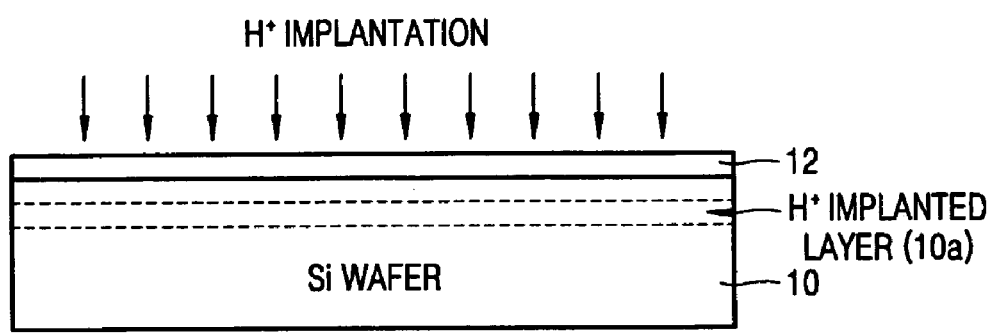

Referring to FIG. 1C, a dividing layer 10a, such as a hydrogen ion implanted layer, is formed at a predetermined distance from the surface of the Si substrate 10, by implanting hydrogen ions H$^+$ from above the first oxide layer 12. Here, the implantation of hydrogen ions H+ is controlled to locate the dividing layer 10a within 1000 Å from the surface of the Si substrate 10.

Figure 1D:
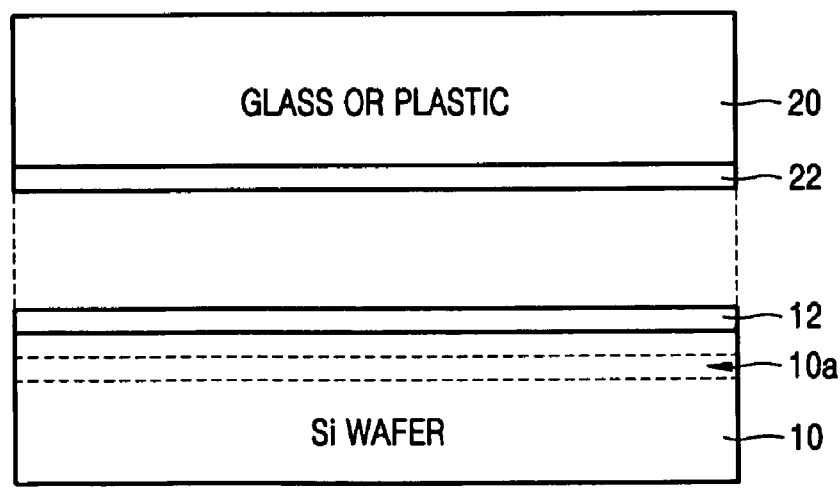

Referring to FIG. 1D, the surfaces of the first oxide layer 12 and the second oxide layer 22 are activated by surface treatment using oxygen plasma, and then the insulating substrate 20 is brought into contact with the Si substrate 10 so that the first oxide layer 12 can bond to the second oxide layer 22 at room temperature.

Figure 1E:
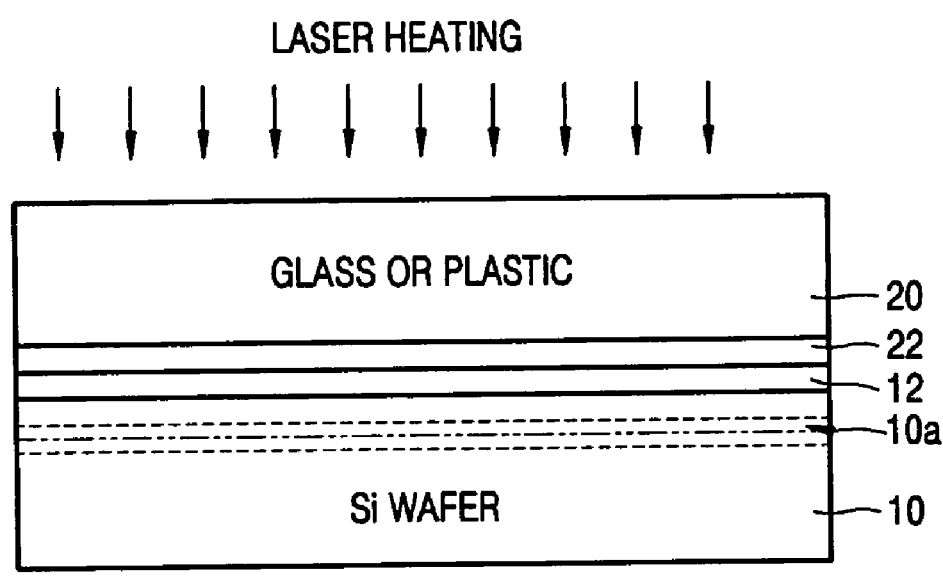

Referring to FIG. 1E, the dividing layer 10a is heated by irradiating a laser beam from above the insulating substrate 20. The laser beam can be a continuous wave (CW) YAG laser beam or an ultra violet pulsed (UV) laser beam, and the wavelength of the laser beam is in the range of 400-800 nm. Preferably, the wavelength of the laser beam is 532 nm. The laser beam heats the dividing layer 10a by passing through the insulating substrate 20 without heating it. The dividing layer 10a in which the hydrogen ions H+ are implanted is in a hydrogen embrittlement state. Thus, the dividing layer 10a is readily cut by a laser beam. In FIG. 1E, the cutting surface of the dividing layer 10a is indicated by an imaginary line.

Figure 1F:
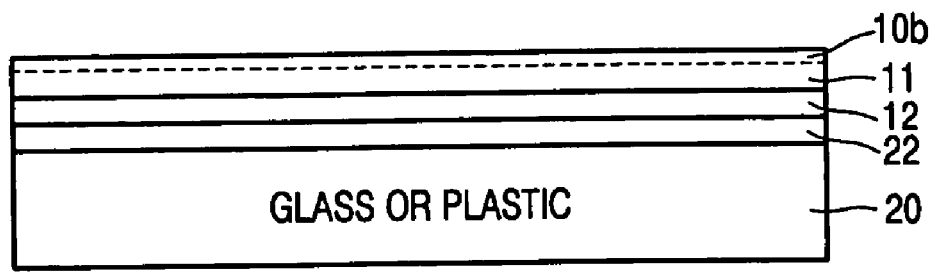

Referring to FIG. 1F, a single crystal Si film 11 is formed on the insulating substrate 20 by dividing the dividing layer 10a. A residue 10b of the dividing layer 10a can remain on the insulating substrate 20 after cutting the dividing layer 10a, and the residue 10b can be removed by polishing. The single crystal Si film 11 on the insulating substrate 20 can be polished to have a predetermined thickness and a plain surface, by a polishing apparatus.

Figure 1G:
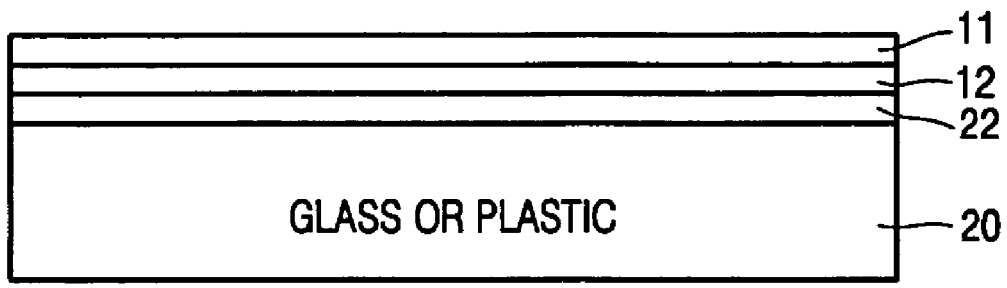

Referring to FIG. 1G, the single crystal Si film 11 having a predetermined thickness can be obtained on the insulating substrate 20 through the aforementioned processes. The thickness of the obtained single crystal Si film 11 is less than 1000 Å.

According to the present invention, the single crystal Si film can be readily obtained. Especially, a high quality single crystal Si film can be obtained on a substrate such as glass or plastic, which may deform during a high temperature process. A single crystal Si film having a desired thickness, especially, less than 100 nm, can be obtained since the dividing layer can be readily formed by controlling the depth of the implantation of hydrogen ions H+ in the Si substrate.

Accordingly, the present invention can realize the system on glass (SOG) and system on plastic (SOP) that uses the single crystal silicon, by forming a single crystal Si film on plastic or glass. Therefore, the manufacturing method of single crystal Si film according to the present invention enables the manufacture of high performance thin film transistors (TFTs) having high reproducibility and uniform performance.

The method of manufacturing a single crystal Si film can be applied not only to a TFT but also any device that uses silicon, such as solar cells.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a single crystal silicon film that includes:
   preparing a Si substrate on which a first oxide layer is formed and an insulating substrate on which a second oxide layer is formed;
   forming a dividing layer that is located less than 1000 Å below a surface of the Si substrate by implanting hydrogen ions;
   bonding the insulating substrate to the Si substrate so that the first oxide layer contacts the second oxide layer;
   cutting the dividing layer by irradiating with a laser beam; and
   removing residue from the dividing layer to form a single crystal silicon film.

2. The method of claim 1, wherein the single crystal silicon film has a thickness that is less than 1000 Å.

3. The method of claim 2, wherein the removing residue from the dividing layer comprises using a polishing apparatus.

4. A method of manufacturing a single crystal Si film comprising:
   preparing a Si substrate on which a first oxide layer is formed and an insulating substrate on which a second oxide layer is formed;
   forming a dividing layer at a predetermined depth of less than 1000 Å from the surface of the Si substrate by implanting hydrogen ions from above the first oxide layer;
   bonding the insulating substrate to the Si substrate so that the first oxide layer contacts the second oxide layer;
   forming a single crystal Si film having a predetermined thickness of less than 1000 Å on the insulating substrate by cutting the dividing layer by irradiating a laser beam from above the insulating substrate, wherein the implanted hydrogen ions are locally heated by the laser beam to cut the dividing layer; and
   removing residue of the dividing layer remaining on the insulating substrate using a polishing apparatus.

5. The method of claim 1, wherein preparing the Si substrate on which a first oxide layer is formed includes:
   preparing the Si substrate; and
   forming the first oxide layer on the surface of the Si substrate.

6. The method of claim 1, wherein preparing the insulating substrate on which a second oxide layer is formed includes:
   preparing the insulating substrate; and
   forming the second oxide layer on a surface of the insulating substrate.

7. The method of claim 1 further comprising activating the first oxide layer and the second oxide layer by treating the surfaces of the first oxide layer and the second oxide layer using oxygen plasma, between forming the dividing layer and bonding the insulating substrate.

8. The method of claim 1, wherein the insulating substrate is a transparent substrate.

9. The method of claim 8, wherein the transparent substrate is a glass substrate or a plastic substrate.

10. The method of claim 1, wherein the laser beam is a CW YAG laser beam or a UV pulsed laser beam.

11. The method of claim 10, wherein the wavelength of the laser beam is in the range of 400-800 nm.

12. The method of claim 1, wherein the laser beam passes through to the implanted hydrogen ions.

13. A method of manufacturing a single crystal Si film, comprising:
   preparing a Si substrate on which a first oxide layer is formed and an insulating substrate on which a second oxide layer is formed;
   forming a dividing layer at a predetermined depth of less than 1000 Å from the surface of the Si substrate by implanting hydrogen ions from above the first oxide layer;

bonding the insulating substrate to the Si substrate so that the first oxide layer contacts the second oxide layer; and forming a single crystal Si film having a predetermined thickness of less than 1000 Å on the insulating substrate by cutting the dividing layer by irradiating a laser beam from above the insulating substrate and removing residue from the dividing layer;

wherein the laser beam passes through to the implanted hydrogen ions;

wherein the implanted hydrogen ions are locally heated by the laser beam to cut the dividing layer; and wherein the laser beam is a CW YAG laser beam or a UV pulsed laser beam.

14. The method of claim 13, wherein the wavelength of the laser beam is in the range of 400-800 nm.

15. The method of claim 13, wherein the insulating substrate is plastic or glass.

16. A method of manufacturing a single crystal Si film, comprising:

preparing a Si substrate on which a first oxide layer is formed and an insulating substrate on which a second oxide layer is formed;

forming a dividing layer at a predetermined depth from the surface of the Si substrate by implanting hydrogen ions from above the first oxide layer;

bonding the insulating substrate to the Si substrate so that the first oxide layer contacts the second oxide layer; and forming a single crystal Si film having a predetermined thickness on the insulating substrate by cutting the dividing layer by irradiating a laser beam from above the insulating substrate;

wherein preparing the Si substrate on which a first oxide layer is formed includes:
preparing the Si substrate; and
forming the first oxide layer is a $SiO_2$ layer on the surface of the Si substrate using chemical vapor deposition (CVD);

wherein preparing the insulating substrate on which a second oxide layer is formed includes:
preparing the insulating substrate; and
forming the second oxide layer is a $SiO_2$ layer on a surface of the insulating substrate using chemical vapor deposition (CVD);

further comprising activating the first oxide layer and the second oxide layer by treating the surfaces of the first oxide layer and the second oxide layer using oxygen plasma, between forming the dividing layer and bonding the insulating substrate;

wherein forming the single crystal Si film having a predetermined thickness on the insulating substrate by cutting the dividing layer by irradiating a laser beam from above the insulating substrate includes:
heating the dividing layer by irradiating a laser beam from above the insulating substrate;
cutting the dividing layer; and
removing residue of the dividing layer remaining on the insulating substrate using a polishing apparatus, to obtain a single crystal Si film having a predetermined thickness on the insulating substrate;

wherein the insulating substrate is a transparent substrate; and wherein the laser beam passes through to the implanted hydrogen ions, wherein the implanted hydrogen ions are locally heated by the laser beam to cut the dividing layer, wherein the transparent substrate is a glass substrate or a plastic substrate;

wherein the dividing layer is located less than 1000 Å below the surface of the Si substrate;

wherein the thickness of the single crystal Si film is less than 1000 Å;

wherein the laser beam is a CW YAG laser beam or a UV pulsed laser beam;

wherein the wavelength of the laser beam is in the range of 400-800 nm; and wherein the implanted hydrogen ions are locally heated by the laser beam to cut the dividing layer.

17. The method of claim 16, wherein the transparent substrate is plastic.

* * * * *